US011201058B2

(12) United States Patent
Anderson et al.

(10) Patent No.: US 11,201,058 B2
(45) Date of Patent: Dec. 14, 2021

(54) GAN DEVICES WITH ION IMPLANTED OHMIC CONTACTS AND METHOD OF FABRICATING DEVICES INCORPORATING THE SAME

(71) Applicant: The Government of the United States of America, as represented by the Secretary of the Navy, Arlington, VA (US)

(72) Inventors: Travis J. Anderson, Alexandria, VA (US); James C. Gallagher, Alexandria, VA (US); Marko J. Tadjer, Vienna, VA (US); Alan G. Jacobs, Arlington, VA (US); Boris N. Feigelson, Springfield, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/927,061

(22) Filed: Jul. 13, 2020

(65) Prior Publication Data

US 2021/0028020 A1    Jan. 28, 2021

Related U.S. Application Data

(60) Provisional application No. 62/878,766, filed on Jul. 26, 2019.

(51) Int. Cl.
*H01L 21/265* (2006.01)
*H01L 29/20* (2006.01)
(Continued)

(52) U.S. Cl.
CPC ...... *H01L 21/26546* (2013.01); *H01L 21/266* (2013.01); *H01L 21/28575* (2013.01);
(Continued)

(58) Field of Classification Search
None
See application file for complete search history.

(56) References Cited

U.S. PATENT DOCUMENTS 8,518,808 B2    8/2013   Feigelson et al.
9,543,168 B2    1/2017   Feigelson et al.
(Continued)

OTHER PUBLICATIONS

J.D. Greenlee et al., "Comparison of AlN Encapsulants for Bulk GaN Multicycle Rapid Thermal Annealing," ECS J. Solid State Sci. Technol. 4, p. 403-p. 407 (2015).
(Continued)

*Primary Examiner* — Jack S Chen
(74) *Attorney, Agent, or Firm* — US Naval Research Laboratory; Joslyn J. Barritt (57) ABSTRACT

A method for activating implanted dopants and repairing damage to dopant-implanted GaN to form n-type or p-type GaN. A GaN substrate is implanted with n- or p-type ions and is subjected to a high-temperature anneal to activate the implanted dopants and to produce planar n- or p-type doped areas within the GaN having an activated dopant concentration of about $10^{18}$-$10^{22}$ cm$^{-3}$. An initial annealing at a temperature at which the GaN is stable at a predetermined process temperature for a predetermined time can be conducted before the high-temperature anneal. A thermally stable cap can be applied to the GaN substrate to suppress nitrogen evolution from the GaN surface during the high-temperature annealing step. The high-temperature annealing can be conducted under $N_2$ pressure to increase the stability of the GaN. The annealing can be conducted using laser annealing or rapid thermal annealing (RTA).

8 Claims, 7 Drawing Sheets

(51) Int. Cl.
    *H01L 29/207*     (2006.01)
    *H01L 21/285*     (2006.01)
    *H01L 29/45*     (2006.01)
    *H01L 21/266*     (2006.01)
    *H01L 21/324*     (2006.01)
    *H01L 29/36*     (2006.01)

(52) U.S. Cl.
    CPC ...... *H01L 21/3245* (2013.01); *H01L 29/2003* (2013.01); *H01L 29/207* (2013.01); *H01L 29/36* (2013.01); *H01L 29/452* (2013.01)

(56) References Cited

U.S. PATENT DOCUMENTS

2019/0341261 A1    11/2019    Feigelson et al.
2021/0028020 A1*    1/2021    Anderson ............... H01L 29/36

OTHER PUBLICATIONS

M.J. Tadjer, et al., "Selective p-type Doping of GaN:Si by Mg Ion Implantation and Multicycle Rapid Thermal Annealing," ECS J. Solid State Sci. Technol. 5, p. 124-p. 127 (2016).

J. D. Greenlee et al., "Process optimization of multicycle rapid thermal annealing of Mg-implanted GaN," 2014 IEEE Workshop on Wide Bandgap Power Devices and Applications, Knoxville, TN, 2014, pp. 59-62.

J. D. Greenlee et al., "From MRTA to SMRTA: Improvements in Activating Implanted Dopants in GaN," ECS Transactions 69(14):197-102.

* cited by examiner

GAN DEVICES WITH ION IMPLANTED OHMIC CONTACTS AND METHOD OF FABRICATING DEVICES INCORPORATING THE SAME

CROSS-REFERENCE

This Application is a Nonprovisional of and claims the benefit of priority under 35 U.S.C. § 119 based on Provisional U.S. Patent Application No. 62/878,766 filed on Jul. 26, 2019. The Provisional Application and all references cited herein are hereby incorporated by reference into the present disclosure in their entirety.

FEDERALLY-SPONSORED RESEARCH AND DEVELOPMENT

The United States Government has ownership rights in this invention. Licensing inquiries may be directed to Office of Technology Transfer, US Naval Research Laboratory, Code 1004, Washington, D.C. 20375, USA; +1.202.767.7230; techtran@nrl.navy.mil, referencing Navy Case #111399.

TECHNICAL FIELD

The present disclosure relates to GaN-based electronic devices, and in particular to ion-implanted ohmic contacts to such GaN-based devices and methods for fabricating lateral and vertical electronic devices incorporating such ion-implanted ohmic contacts.

BACKGROUND

GaN is a superior material for the fabrication of high frequency and high power devices. The high electron mobility transistor (HEMT) has proven to be a groundbreaking technology for RF power amplifiers for both civilian and defense applications. To achieve high power density and high efficiency in such devices, extremely low resistance ohmic contacts are required for the source and drain region of the transistor. The present industry standard for fabrication of low resistance ohmic contacts is the selective area regrowth method, which can form highly conductive N+ GaN regions.

However, ion implantation offers several advantages over the selective area regrowth method. Ion implantation reduces the number of steps in the fabrication process, prevents impurity formation from occurring at the implant/regrowth interface, allows the process to make the device truly planar thus reducing the number of critical field points, and allows tailoring of both vertical and lateral profile doping. The cycle time required for ion implantation and activation annealing is much less than for epitaxial growth, multiple wafers can be run at the same time, thus substantially improving throughput, and the identical process can be applied to both Ga-polar and N-polar structures without any special modifications. In addition, lateral devices such as photoconductive switches and p-n junction gated field effect transistors (LJFET), as well as vertical devices such as p-n junction gated field effect transistors (JFET), current aperture vertical electron transistors (CAVET), double diffused metal oxide semiconductor field effect transistors (DMOS), and trench MOSFET devices could all also potentially utilize this technology, since selective-area doping is required for all of these devices.

Ion implantation is the industry standard method for doping Si and SiC devices. However, since activation of ion implants in GaN requires temperatures above the decomposition temperature, this method is not presently used commercially for GaN-based devices. Previous work by researchers at the Naval Research Laboratory, including some of the inventors of the present invention, has demonstrated that Mg ion implantation is possible through a symmetric multicycle rapid thermal annealing (SMRTA) and that Mg ion implantation through the SMRTA process can make p-type GaN. See J. D. Greenlee et al., "Comparison of AlN Encapsulants for Bulk GaN Multicycle Rapid Thermal Annealing," ECS J. Solid State Sci. Technol. 4, P403-P407 (2015); M. J. Tadjer, et al., "Selective p-type Doping of GaN:Si by Mg Ion Implantation and Multicycle Rapid Thermal Annealing," ECS J. Solid State Sci. Technol. 5, P124-P127 (2016

The SMRTA process includes an annealing sequence consisting of periods of annealing at conventional annealing temperatures with spikes to metastable temperature regimes, combined with the application of nitrogen overpressure to stabilize the GaN crystal and increase the temperature at which it can be annealed as well as placement of a thermally stable cap on the upper surface of the GaN crystal to protect its surface from dissociating into Ga and N at the high metastable annealing temperatures. See U.S. Pat. No. 8,518,808 to Feigelson et al., "Defects Annealing and Impurities Activation in III-Nitride Compound," U.S. Pat. No. 9,543,168 to Feigelson et al., "Defects Annealing and Impurities Activation in Semiconductors at Thermodynamically Non-Stable Conditions," and U.S. Patent Application Publication No. 2019/0341261, "Implanted Dopant Activation for Wide Bandgap Semiconductor Electronics," all of which share at least one inventor in common with the present disclosure.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides epitaxial GaN devices having highly doped ion-implanted n- or p-type contact regions under metal contacts, where the contact regions have activated dopant concentrations of from about $10^{18}$ cm$^{-3}$ to about $10^{22}$ cm$^{-3}$ or more and where the doped regions are planar to the epitaxial GaN surface, and further provides methods for activating implanted dopants and repairing damage to dopant-implanted GaN so as to form the n-type or p-type regions in GaN.

To form n-type regions in GaN, a GaN substrate is masked and the exposed areas are implanted with n-type ions such as Si or Ge. The n-implanted GaN is annealed at high temperatures to activate the implanted n-type dopants, i.e., to produce electrical carriers in the material and to produce planar areas of activated n-type GaN within the GaN substrate. In some embodiments, the ion-implanted GaN can optionally be subjected to a first annealing at temperatures at which the GaN remains stable. In some embodiments, a thermally stable cap can be applied to the GaN substrate to suppress nitrogen evolution from the GaN surface during the high-temperature annealing, while in other embodiments, the high-temperature annealing can be conducted under moderate N$_2$ pressure to increase the stability of the GaN and reduce the evolution of the N$_2$ from the GaN. In still other embodiments, the annealing can be conducted using transient annealing techniques such as laser annealing or rapid thermal annealing (RTA) to reduce exposure of GaN to a metastable regime.

To form p-type GaN regions, a GaN substrate is masked and the exposed areas are implanted with p-type ions such as Mg or Be. The p-implanted GaN is then first annealed at temperatures at which the GaN remains stable and then is annealed at high temperatures to activate the implanted p-type dopants, i.e., to produce electrical carriers in the material and to produce planar areas of activated p-type GaN within the GaN substrate. In some embodiments, a thermally stable cap can be applied to the GaN substrate to suppress nitrogen evolution from the GaN surface during the high-temperature annealing step, while in other embodiments, the high-temperature annealing can be conducted under moderate N$_2$ pressure to increase the stability of the GaN and reduce the evolution of the N$_2$ from the GaN. In still other embodiments, the annealing can be conducted using transient annealing techniques such as laser annealing or rapid thermal annealing (RTA) to reduce exposure of GaN to a metastable regime.

Ohmic contacts can then be formed on the n- or p-type areas of the GaN as appropriate to form vertical or lateral electrical devices such as JFETs, CAVETs, DMOS devices, MOSFET devices, HEMT devices, or PCSS devices.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present invention provides epitaxial GaN devices having highly doped ion-implanted n- or p-type contact regions under metal contacts, where the contact regions have activated dopant concentrations of about $10^{18}$ cm$^{-3}$ to about $10^{22}$ cm$^{-3}$ and where the doped regions are planar to the epitaxial GaN surface, and further provides methods for activating implanted dopants and repairing damage to dopant-implanted GaN so as to form the n-type or p-type regions in GaN.

The activated ion-implanted n-type and p-type regions in GaN can be is achieved using components of the SMRTA process developed by inventors at NRL to create n-type or p-type GaN using ion implantation of Si or other- dopants into GaN. N-type dopants are significantly more abundant in the GaN materials system, exhibit lower electrical activation energy than p-type dopants and can be activated at lower temperatures. Thus, while the use of overpressure and application of a thermally stable cap such as is used in the SMRTA process greatly facilitates dopant activation, the temperature spikes to metastable temperature regimes used in the SMRTA process is not necessary to activate n-type dopants, nor is pressure always necessary to activate n-type dopants.

Implantation of n- or p-type dopants in accordance with the present invention can be performed on unintentionally doped GaN, semi-insulating GaN such as carbon doped GaN, or on AlGaN/GaN heterostructures situated on GaN, SiC, Si, sapphire, or composite engineered substrates.

Implantation of dopants into GaN damages the lattice structure of the GaN crystal and causes it to have low mobility and become highly resistive. To repair this lattice damage after implantation and activate the implanted dopant impurities, the GaN structure must be annealed, with the annealing taking place at high temperatures at which the ion-implanted GaN crystal is metastable at atmospheric pressure, i.e., above the equilibrium thermal decomposition limit of about 850° C., all the while maintaining the structural integrity of the GaN crystal. The annealing temperature required to activate the implanted dopants and repair the damage caused by the dopant implantation is typically in the 900-1600° C. range for n-type dopants and 1200-1600° C. range for p-type dopants.

Figure 1:
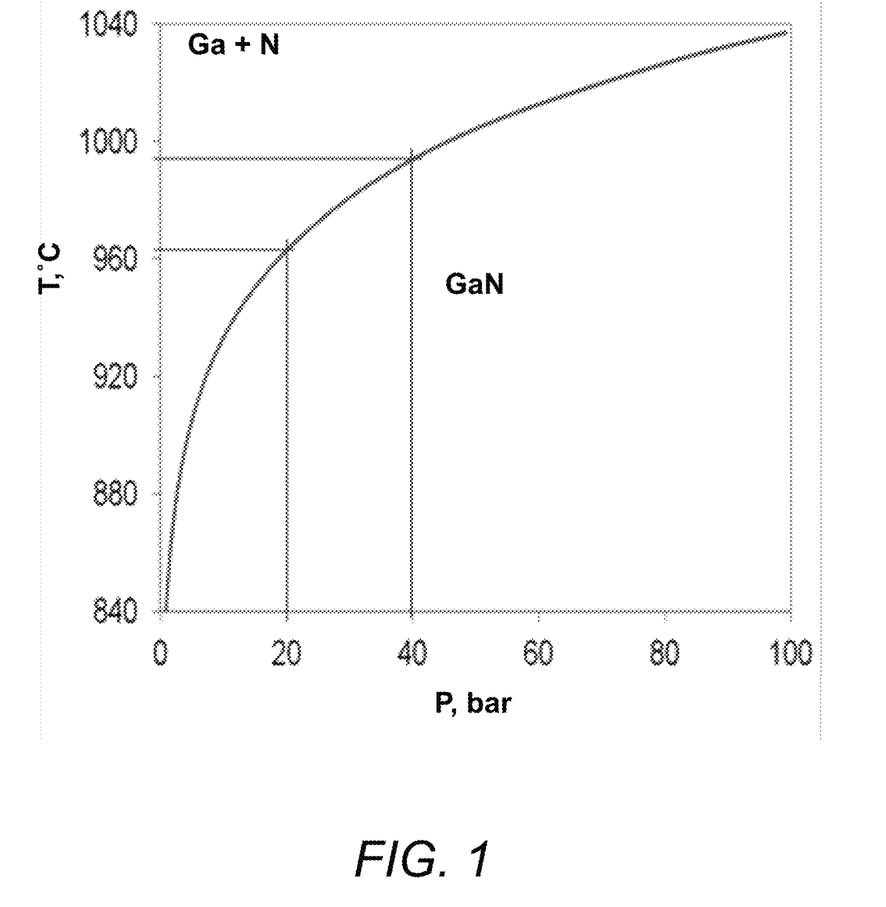
FIG. 1 is a plot illustrating aspects of vapor pressure of nitrogen over GaN under a range of temperatures.

However, as can be seen from the phase diagram shown in FIG. 1, GaN decomposes into its constituent elements Ga+N when heated to approximately 850° C. at atmospheric pressure. Mitigation of this decomposition is critical since nitrogen vacancies and other complexes formed by the decomposition cause leakage paths and degrade device performance.

Thus, in accordance with the present invention, the ion-implanted GaN must be protected during this metastable annealing to properly activate dopants and mitigate damage to the device structure. This protection of the GaN can be achieved by any one or a combination of the following approaches developed by the inventors as part of the SMRTA technique described in U.S. Pat. Nos. 8,518,808, 9,543,168, and U.S. Patent Application Publication No. 2019/0341261, supra.

An exemplary process flow for forming highly doped activated ion-implanted planar n-type regions in GaN in accordance with the present invention is illustrated by the block schematics shown in FIGS. 2A-2H.

Figure 2A:
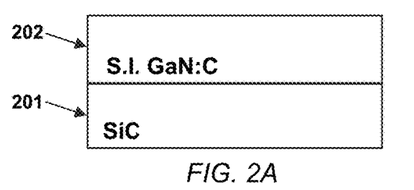
FIGS. 2A-2H provide a flow diagram illustrating exemplary process steps in a method for forming ion-implanted GaN ohmic contacts and for fabricating electronic devices incorporating such ion-implanted GaN ohmic contacts in accordance with the present invention.

As shown in FIG. 2A, the process begins with the deposition of a GaN film 202 on a SiC substrate 201, where the GaN film can be formed by any suitable technique known in the art such as MOCVD, HVPE, or MBE. The GaN can optionally be initially doped with carbon (with the GaN thus being denoted as S.I. GaN:C in the FIGURES) to make it semi-insulating.

Figure 2B:
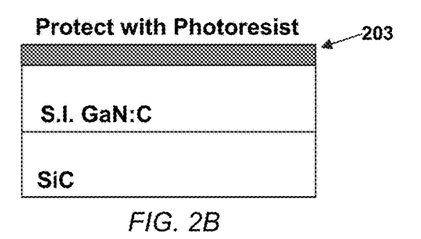
Figure 2C:
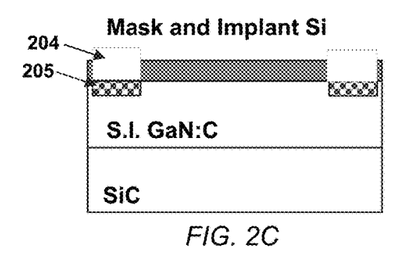
Figure 2D:
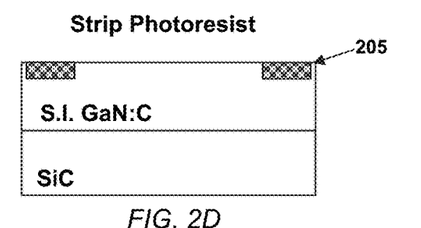

In a second step in a process for fabricating an electronic device incorporating n-type GaN in accordance with the present invention, as illustrated in FIG. 2B, a sacrificial mask 203, e.g., a mask from standard photolithography photoresist or a hard mask, is deposited on an upper surface of the GaN to protect areas of the sample which are not to be implanted by Si. In a third step, illustrated in FIG. 2C, photomask 203 is selectively removed to expose regions 204 of the GaN to be implanted with n-type dopants, and the dopants are implanted into the exposed regions of the GaN to form doped regions 205, where implantation can be accomplished using any suitable implantation tool known in the art. Following implantation, in the next step, the mask is removed, as illustrated in FIG. 2D, to expose the GaN surface for further processing.

Figure 2E:
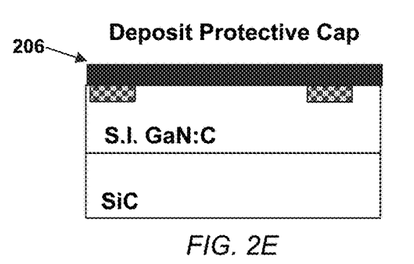

In one approach, aspects of which are illustrated in FIG. 2E, one or more thermally stable caps 206 can be applied to the upper surface of the n-implanted GaN to suppress nitrogen evolution from the GaN surface. The cap can comprise AlN, SiN, or other stable materials or composite structures of multiple materials are capable of protecting the crystal from decomposition.

In another approach, moderate $N_2$ pressure can be applied during annealing with the $N_2$ pressure increasing the stability of the GaN and reducing the evolution of $N_2$ from the GaN crystal. Application of an $N_2$ overpressure of up to about 100 bar in combination with use of a protective cap has been shown to stabilize the GaN at temperatures exceeding 1200° C. for short times.

In still another approach, transient annealing techniques such as laser annealing or rapid thermal annealing (RTA) can be used to reduce exposure of GaN to a metastable regime and kinetically limit decomposition or nitrogen evolution. See U.S. Pat. Nos. 8,518,808 and 9,543,168, supra; see also U.S. Patent Application Publication No. 2019/0341261, supra.

Irrespective of the approach used for this high-temperature annealing, it has been found that improved annealing of the n-implanted GaN can often be achieved by means of an optional first annealing step, where the n-implanted GaN is initially annealed for a predetermined period of time at a predetermined temperature when GaN is still stable before it is annealed at metastable temperatures. This initial stable annealing reduces the initial defect populations in the GaN and improves its tolerance of metastable annealing. See J. D. Greenlee et al., "Process optimization of muiticycle rapid thermal annealing of Mg-implanted GaN," 2014 IEEE Workshop on Wide Bandgap Power Devices and Applications, Knoxville, Tenn., 2014, pp. 59-62; see also J. D. Greenlee et al., "From MRTA to SMRTA: Improvements in Activating Implanted Dopants in GaN," *ECS Transactions* 69(14):97-102. The specific time and temperature of this initial stable annealing can be tailored to the maximum temperature at which the GaN is stable at the process pressure and for durations necessary to improve resultant GaN mobility or activation, but typically is done below about 850° C. under atmospheric pressure for up to several hours but can be done at up to 1050° C. for a few seconds.

Figure 2F:
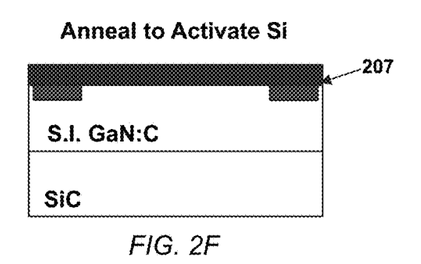

In the next step of a process for fabricating an electronic device incorporating ion-implanted GaN in accordance with the present invention, as illustrated in FIG. 2F the n-implanted GaN is then annealed at high temperatures to activate the implanted n-type dopants, i.e., to produce electrical carriers in the material and to produce activated planar n-type regions 207 within the GaN. Such annealing is typically conducted at temperatures of about 900 to about 1600° C. and at pressures ranging from 1 atm to about 100 bar. The annealing time in this step can vary from a few seconds to about an hour, with higher temperatures needing less time.

Figure 2G:
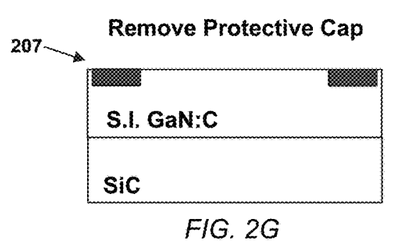

If a protective cap was applied to protect the GaN surface from damage during the metastable annealing, in the next step of a process for fabricating an electronic device incorporating regions of n-type GaN in accordance with the present invention, as illustrated in FIG. 2G, the protective cap is then removed to expose the annealed n-type areas in the GaN, where removal can be achieved using any suitable method known in the art, such as by means of plasma etching or by means of chemical etching using hydrofluoric acid (HF), potassium hydroxide (KOH), or the AZ400K developer available from AZ Industries.

Figure 2H:
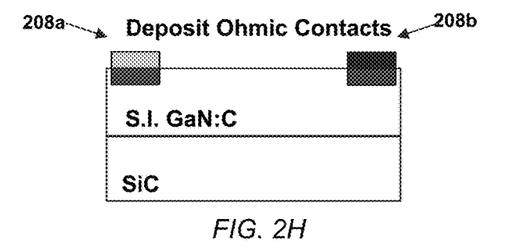

Finally, as illustrated in FIG. 2H, ohmic contacts 208a/208b are deposited on an upper surface of the n-GaN areas of the GaN crystal, with the material and placement of the contacts being configured as appropriate for the specific device structure and design considerations.

The implantation and annealing process in accordance with the present invention results in a GaN substrate with highly n-doped GaN regions having an activated n-type dopant concentration of about $10^{18}$ cm$^{-3}$ to about $10^{22}$ cm$^{-3}$, where the doped regions are planar to the epitaxial GaN film.

Highly p-doped regions in GaN with activated p-type dopant ions having a concentration of about $10^{18}$ cm$^{-3}$ to about $10^{22}$ cm$^{-3}$ can be similarly produced by doping the GaN with p-type dopants such as Mg or Be. However, activation of such p-type dopants typically requires annealing at higher temperatures or for longer durations to further reduce ion implantation damage.

Producing such highly p-doped regions in GaN typically requires the initial annealing step that is optional for n-doped GaN, before the doped GaN is subjected to high temperature annealing, i.e., an initial anneal at a temperature at which GaN is still stable at the process pressure and process time, e.g., below about 850° C. for several hours at atmospheric pressure or up to about 1050° C. for a few minutes at atmospheric pressure. Following this initial annealing step, the p-doped GaN is subjected to a metastable annealing regime similar to that described above with respect to n-doped GaN to activate the implanted p-type dopants, i.e., to produce electrical carriers in the material and to produce activated planar p-type regions within the GaN. As with the annealing of n-doped GaN, such annealing is typically conducted at temperatures of about 1200 to about 1600° C. and at pressures ranging from 1 atm to about 100 bar. The annealing time in this step can vary from a few seconds to about an hour, with higher temperatures needing less time. The protective measures described above, such as the deposition of a protective cap or the application of nitrogen overpressure, can be employed to prevent the GaN from decomposing into Ga and $N_2$ during this high-temperature annealing.

The result of the annealing process in accordance with the present invention is a GaN substrate which has one or more regions having a high ($10^{18}$ cm$^{-3}$ to about $10^{22}$ cm$^{-3}$) concentration of activated p-type dopants, where the highly doped regions are planar to the epitaxial GaN surface.

Figure 3A:
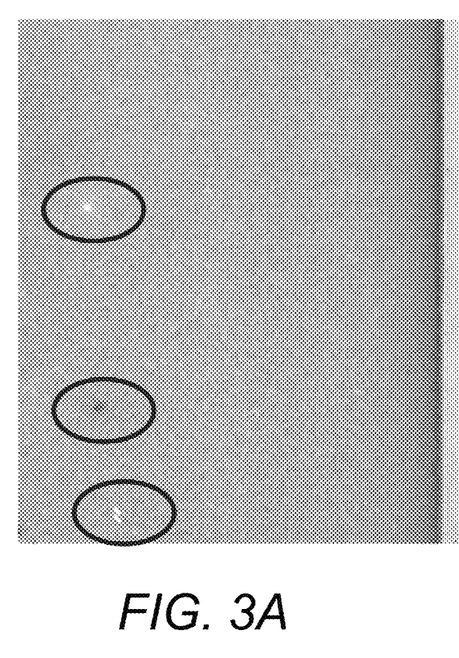
FIGS. 3A and 3B are photographic images illustrating damage caused by thermal annealing GaN above the thermal decomposition limit when a protective cap is not used cap (FIG. 3A) and reduced damage when a protective cap is used (FIG. 3B).
Figure 3B:
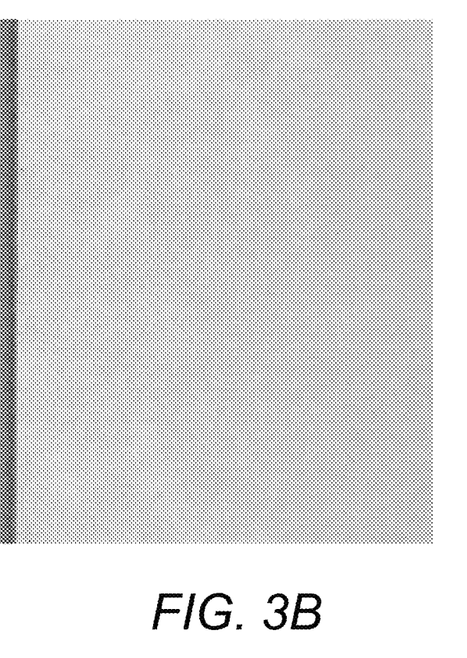

As noted above, one way to protect the GaN from decomposing into its constituent elements during the metastable annealing step is to deposit a thermally stable cap onto the GaN surface. The beneficial effects of using such a cap can be seen from the images shown in FIGS. 3A and 3B. FIG. 3A shows the surface of an ion-implanted GaN sample and shows multiple areas where the surface of the GaN is damaged. In contrast, the GaN sample shown in FIG. 3B was protected by a cap during high-temperature metastable annealing in accordance with the present invention, and as can be seen from FIG. 3B, is free from any visible defects.

Figure 4:
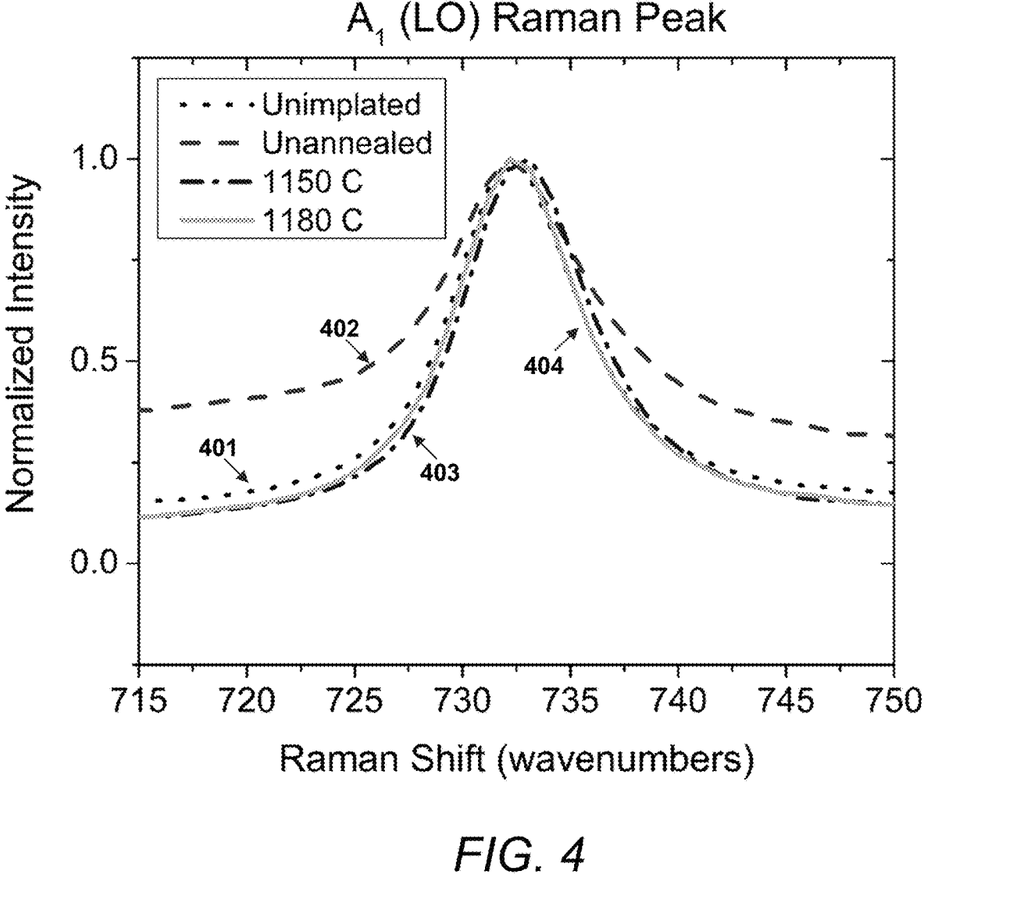
FIG. 4 is a plot illustrating spectral broadening observed of the Raman A$_1$(LO) peak indicating damage to a GaN sample incurred due to ion implantation and subsequent recovery after the sample is annealed at high temperatures.

As noted above, the annealing temperature required to activate the implanted dopants and repair the damage caused by the dopant implantation is typically in the 900-1600° C. range for n-type dopants and 1200-1600° C. range for p-type dopants. The benefits of this high-temperature annealing can be seen from the plots in FIG. 4. The crystal damage caused by n-dopant implantation can be observed using the $A_1$ peak in a Raman spectra, as illustrated by the plots in FIG. 4A. The dotted line 401 in FIG. 4 shows the Raman peak for a raw, unimplanted sample. After n-dopant implantation, the Raman peak broadens (line 402), indicating Raman dispersion from implant-induced vacancies and damage. Annealing at both 1150° C. (403) and 1180° C. (404) narrows the width of the Raman peak to bring it closer to the peak shown by the unimplanted sample, indicating recovery of the damage to the GaN crystal introduced by ion implantation.

Figure 5A:
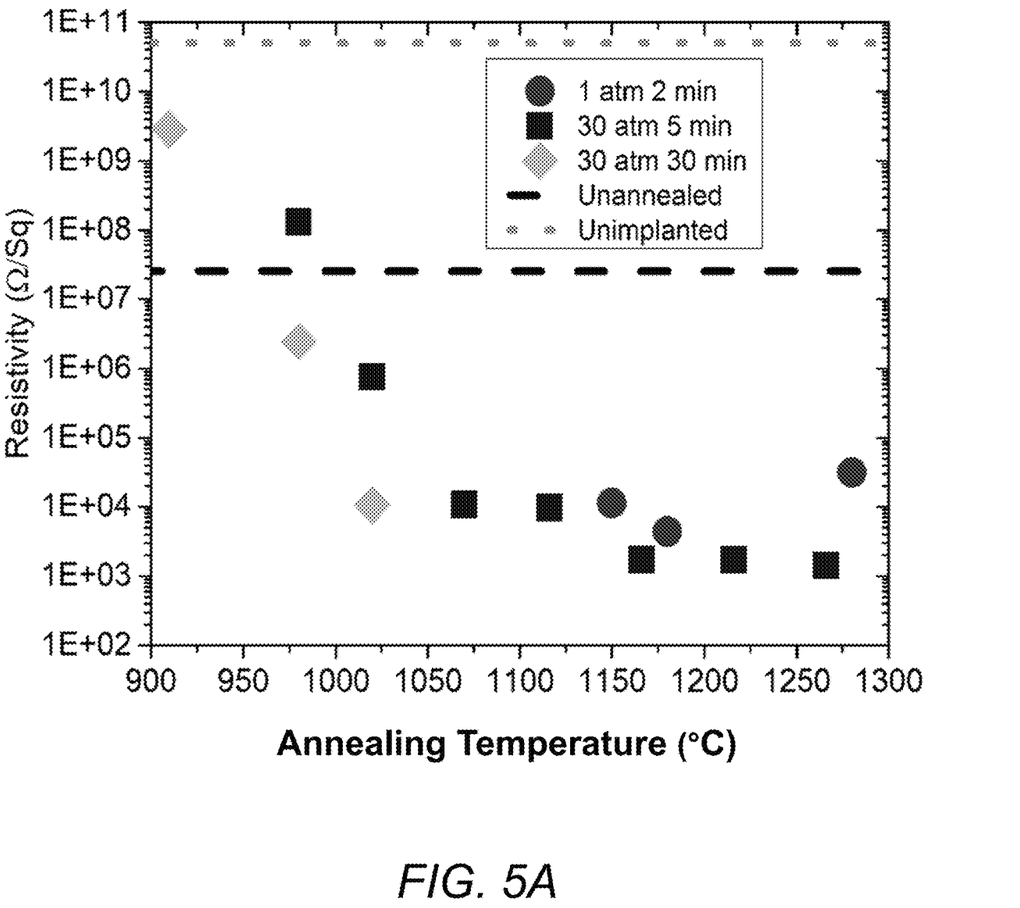
FIGS. 5A-5C are plots illustrating electrical properties of unannealed ion-implanted GaN samples and ion-implanted GaN sample that have been annealed in accordance with the present invention.
Figure 5B:
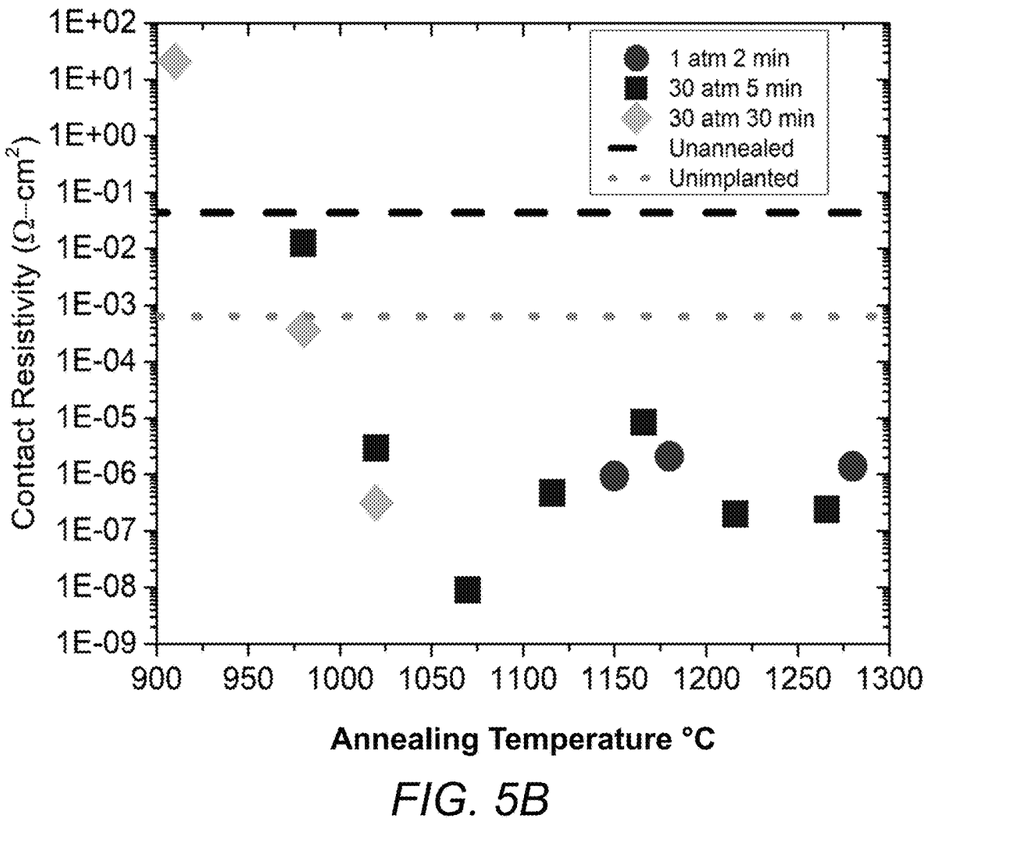
Figure 5C:
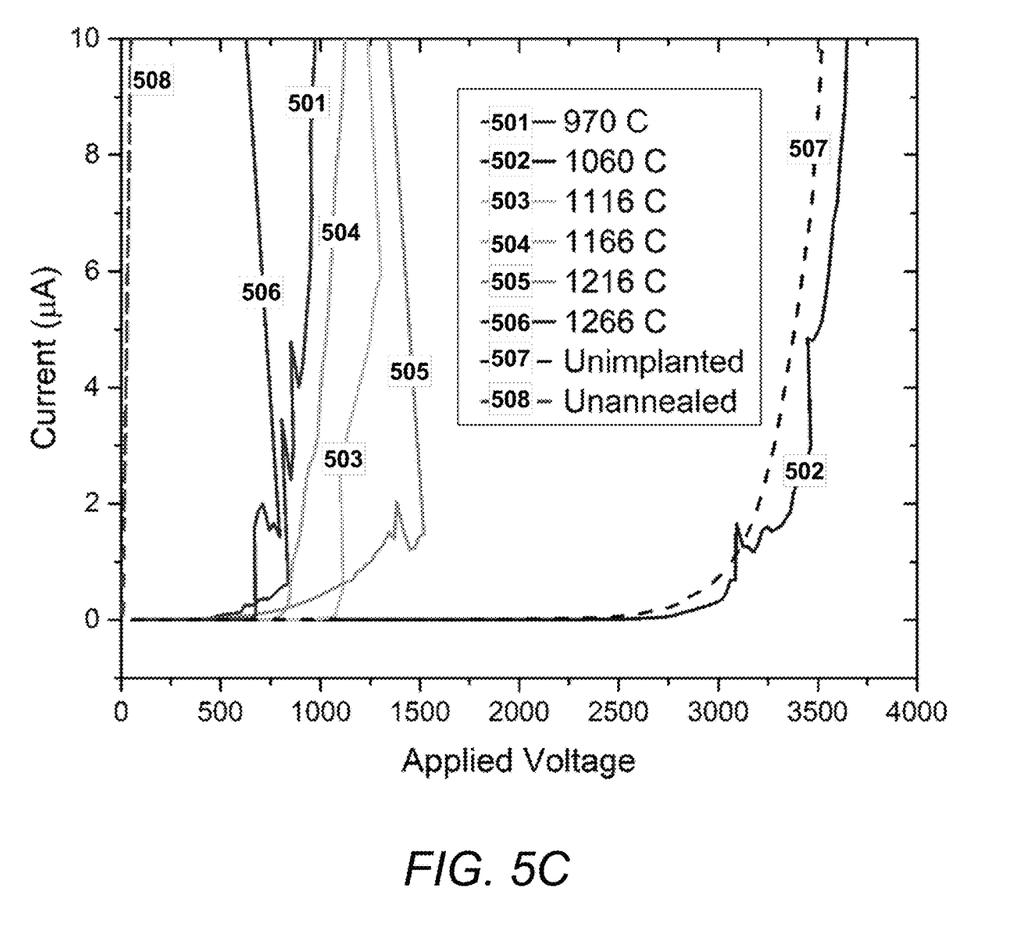

The results of annealing under different conditions are shown by the plots in FIGS. 5A-5C. The plot in FIG. 5A shows that the resistivity of an n-doped GaN sample drops as the annealing temperature increases until it reaches a minimum above an annealing temperature of around 1050° C. This minimum resistivity also corresponds to a minimum in contact resistivity in the $10^{-6}$ Ω-cm scale, as seen by the plot in FIG. 5B, which illustrates that low contact resistance, beyond that exhibited by both unimplanted and unannealed samples, can be obtained after the implanted samples are annealed.

The impact of the annealing process on the unimplanted regions is equally important to device operation as these must remain capable of sustaining high electric field. To this end, any additional damage introduced by decomposition of the crystal is critical. The plot in FIG. 5C illustrates the current traveling through unimplanted regions of the GaN sample between implanted contacts as a function of voltage for devices annealed at different temperatures (plot lines 501-506) for 5 minutes at 30 atm pressure fabricated as described above with respect to FIGS. 1A-1H. The reference curve 507 for a device fabricated from unimplanted and unannealed GaN shows a breakdown around 3000 V. As can be seen from the plots in FIG. 5C, annealing under non-optimized conditions, either too cold to reduce the ion implantation damage (lines 501 and unannealed 508) or too hot, which generates additional defects (lines 503, 504, 505, 506) decreases breakdown voltage and increases leakage current by at least a factor of 2, under more optimal conditions of annealing near 1050° C. (line 502) the breakdown voltage increases beyond that exhibited by the as-grown, unimplanted, unannealed material.

The highly doped planar ion-implanted n- and p-type GaN produced by the implantation and annealing process in accordance with the present invention can be incorporated into many different electronic devices known in the art, including vertical devices such as JFETs, CAVETs, DMOS devices, and MOSFET devices and lateral devices such as HEMTs and PCSS devices, All of these devices can be synthesized with fewer processing steps by using the n-type ion implantation technique and annealing processes of the present invention. Most notably though, this process can be used to significantly simplify the contact process in both Ga-polar and N-polar High Electron Mobility Transistors (HEMTs) as described above by obviating the need for regrowth of contacts, thus eliminating a slow and costly step as well as removing an interface which causes leakage and breakdown pathways. Another significant aspect of the process of the present invention is that it can potentially be performed in a foundry with modifications to the fabrication sequence and/or process tools.

A method for activating implanted dopants and repairing damage caused by the dopant implantation has been described. Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for selectively forming at least one n-doped region in an epitaxial GaN substrate, the method including the steps of:
    selectively applying a mask to a predetermined region of the GaN substrate;
    implanting n-type dopant ions into at least one predetermined unmasked region of the GaN substrate to form an n-implanted GaN substrate;
    removing the mask from the n-implanted GaN substrate;
    subjecting the n-implanted GaN substrate to a high-temperature annealing at a predetermined temperature between 900 and 1600° C. for a predetermined time between a few seconds and a few hours and at a predetermined pressure between about 1 atm and about 100 bar to activate the implanted n-dopant ions and to produce at least one electrically activated doped region within the GaN;
    wherein the electrically activated n-doped region is planar to an upper surface of the epitaxial GaN substrate and has a concentration of activated implanted n-type dopant ions of about $10^{18}$ cm$^{-3}$ to about $10^{22}$ cm$^{-3}$.

2. The method according to claim 1, further including the step of subjecting the n-implanted GaN substrate to a first annealing at a predetermined temperature at which the GaN is stable at a predetermined process temperature for a predetermined time of a few seconds to several hours.

3. The method according to claim 2, wherein the first annealing is conducted at a temperature of about 850° C. for several hours at atmospheric pressure.

4. The method according to claim 2, wherein the first annealing is conducted at a temperature between about 850° C. and about 1050° C. for a few minutes at atmospheric pressure.

5. The method according to claim 1, further including applying a thermally protective cap to an upper surface of the n-implanted GaN before annealing, the cap being configured to suppress evolution of nitrogen from the GaN during annealing.

6. The method according to claim 1, further including applying a nitrogen overpressure of up to about 100 bar during the high-temperature annealing to further stabilize the GaN.

7. The method according to claim 1, wherein the high-temperature annealing is conducted by means of laser annealing or rapid thermal annealing (RTA).

8. The method according to claim 1, wherein the n-dopant ions comprise Si or Ge.

\* \* \* \* \*